(12) United States Patent
Wimmer et al.

(10) Patent No.: US 10,586,901 B2
(45) Date of Patent: Mar. 10, 2020

(54) LED MODULE HAVING A HIGHLY REFLECTIVE CARRIER

(71) Applicant: TRIDONIC JENNERSDORF GMBH, Jennersdorf (AT)

(72) Inventors: Florian Wimmer, Neumarkt a.d. Raab (AT); Peter Pachler, Graz (AT); Norbert Reitinger, Graz (AT); Juergen Gumhold, Jennersdorf (AT)

(73) Assignee: TRIDONIC JENNERSDORF GMBH, Jennersdorf (AT)

( * ) Notice: Subject to any disclaimer, the term of this patent is extended or adjusted under 35 U.S.C. 154(b) by 187 days.

(21) Appl. No.: 14/378,581

(22) PCT Filed: Feb. 7, 2013

(86) PCT No.: PCT/EP2013/052435
§ 371 (c)(1),
(2) Date: Aug. 13, 2014

(87) PCT Pub. No.: WO2013/120760
PCT Pub. Date: Aug. 22, 2013

(65) Prior Publication Data
US 2015/0016107 A1    Jan. 15, 2015

(30) Foreign Application Priority Data

Feb. 13, 2012 (DE) .................. 10 2012 202 089
Apr. 27, 2012 (AT) .................. GM186/2012
(Continued)

(51) Int. Cl.
*H01L 33/60*    (2010.01)
*H01L 25/075*    (2006.01)
(Continued)

(52) U.S. Cl.
CPC .......... *H01L 33/60* (2013.01); *H01L 25/0753* (2013.01); *H01L 25/13* (2013.01);
(Continued)

(58) Field of Classification Search
CPC ......... H01L 33/60; H01L 33/52; H01L 33/44; F21V 9/16; H05K 2201/09909
(Continued)

(56) References Cited

U.S. PATENT DOCUMENTS 8,415,693 B2    4/2013  Inobe et al.
2003/0173655 A1*    9/2003  Rissing .................. H01L 23/24
                                                            257/667
(Continued)

FOREIGN PATENT DOCUMENTS

CN    101794855    8/2010
DE    10245946    10/2003
(Continued)

OTHER PUBLICATIONS

International Search Report for PCT/EP2013/052435, English translation attached to original, Both completed by the European Patent Office dated Jun. 11, 2013, All together 11 Pages.
(Continued)

*Primary Examiner* — Zheng Song
(74) *Attorney, Agent, or Firm* — Volpe and Koenig, P.C.

(57) ABSTRACT

An LED module, including a carrier having high reflectivity, wherein a metal layer, preferably a silver layer or a layer of high-purity aluminum, is applied to the carrier. Also disclosed is an LED module, including a carrier having high reflectivity, wherein a metal layer is applied to the carrier, at least one LED chip, and a dam, wherein the metal layer partially covers the surface of the carrier lying under the dam.

18 Claims, 9 Drawing Sheets

(30) Foreign Application Priority Data

Figure 1A:
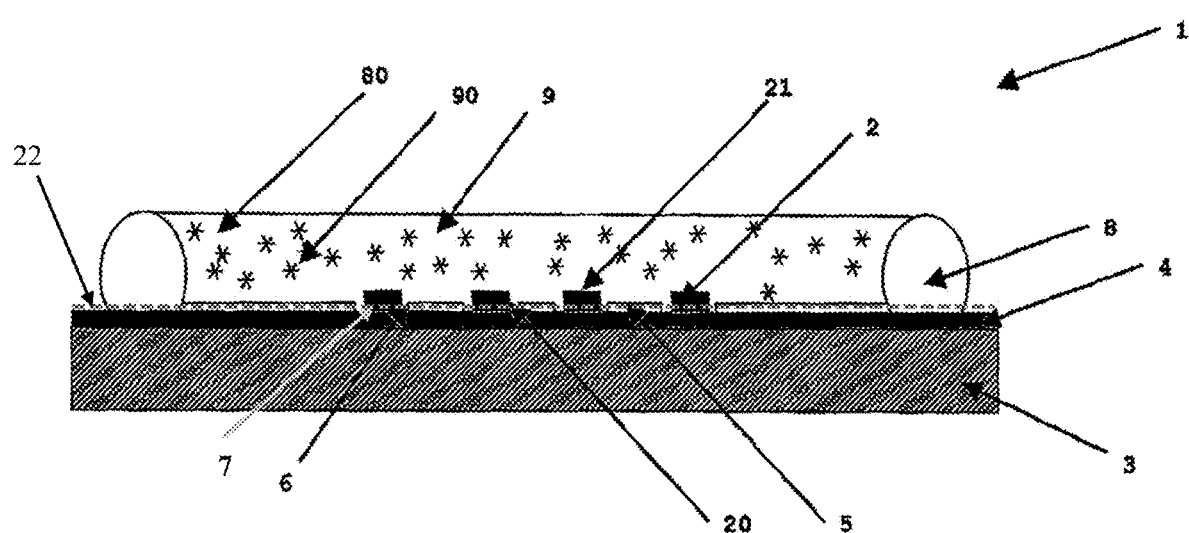

Dec. 13, 2012 (DE) .................. 10 2012 223 039
Dec. 13, 2012 (DE) .................. 20 2012 011 948 U

(51) Int. Cl.

| | | |
|---|---|---|
| *H01L 33/64* | (2010.01) | |
| *H05K 1/02* | (2006.01) | |
| *H01L 25/13* | (2006.01) | |
| *H01L 33/52* | (2010.01) | |
| *H01L 23/00* | (2006.01) | |

(52) U.S. Cl.
CPC .............. *H01L 33/52* (2013.01); *H01L 33/64* (2013.01); *H05K 1/0274* (2013.01); *H01L 24/48* (2013.01); *H01L 2224/48091* (2013.01); *H01L 2224/48137* (2013.01); *H01L 2224/48227* (2013.01); *H01L 2924/00014* (2013.01); *H01L 2924/12041* (2013.01); *H01L 2924/181* (2013.01); *H05K 1/021* (2013.01); *H05K 2201/09909* (2013.01); *H05K 2201/10106* (2013.01); *H05K 2201/2054* (2013.01)

(58) Field of Classification Search
USPC ................... 362/249.02, 84; 257/88, 98, 100
See application file for complete search history.

(56) References Cited

U.S. PATENT DOCUMENTS

| | | | |
|---|---|---|---|
| 2004/0222433 A1 | 11/2004 | Mazzochette et al. | |
| 2007/0290328 A1* | 12/2007 | Lin ..................... | F21K 9/00 257/701 |
| 2009/0315057 A1* | 12/2009 | Konishi ................ | H01L 24/97 257/98 |
| 2010/0193825 A1 | 8/2010 | Yang | |
| 2011/0001148 A1 | 1/2011 | Sun et al. | |
| 2011/0001156 A1 | 1/2011 | Matsuda et al. | |
| 2011/0121326 A1* | 5/2011 | Tan ...................... | H01L 33/60 257/88 |
| 2011/0180817 A1 | 7/2011 | Ishizaki et al. | |
| 2011/0186874 A1* | 8/2011 | Shum ................... | H01L 25/0753 257/88 |
| 2011/0248287 A1 | 10/2011 | Yuan et al. | |
| 2011/0254039 A1* | 10/2011 | Kim ..................... | H01L 33/46 257/98 |
| 2011/0278618 A1* | 11/2011 | Nakayama ............ | H01L 33/44 257/98 |
| 2012/0002420 A1 | 1/2012 | Imai et al. | |
| 2012/0014110 A1* | 1/2012 | Sanpei ................. | H01L 33/56 362/296.04 |
| 2012/0025247 A1* | 2/2012 | Ooyabu ................ | H01L 33/52 257/98 |
| 2012/0112236 A1* | 5/2012 | Higuma ............... | H01L 33/641 257/98 |
| 2012/0275166 A1* | 11/2012 | Nakayama ........... | H01L 33/486 362/296.01 |
| 2013/0009190 A1* | 1/2013 | Memida ............... | H01L 33/486 257/98 |
| 2013/0039013 A1 | 2/2013 | Waegli et al. | |
| 2013/0105837 A1* | 5/2013 | West .................... | H01L 33/60 257/98 |

FOREIGN PATENT DOCUMENTS

| | | |
|---|---|---|
| DE | 102008032170 | 1/2009 |
| DE | 102010011604 | 9/2011 |
| DE | 102010027748 | 10/2011 |
| DE | 202007019330 | 10/2011 |
| EP | 1953818 | 8/2008 |
| EP | 2160082 | 3/2010 |
| EP | 2261548 | 12/2010 |
| EP | 2384100 | 11/2011 |
| EP | 2387083 | 11/2011 |
| EP | 2403324 | 1/2012 |
| JP | 2003051620 | 2/2003 |
| JP | 2011151248 | 8/2011 |
| WO | 2011097393 | 8/2011 |
| WO | 2011125346 | 10/2011 |
| WO | 2011136446 | 11/2011 |

OTHER PUBLICATIONS

German Search Report for German Application No. DE 102012202089.6, dated Aug. 16, 2012, 10 Pages.
German Search Report for German Application No. DE 202012011948.6, dated Nov. 27, 2013, 8 Pages.
Chinese Search Report for Chinese Application No. CN 2013800187647, Completed by the Chinese Patent Office, dated Jan. 18, 2017, 2 Pages.

\* cited by examiner

LED MODULE HAVING A HIGHLY REFLECTIVE CARRIER

CROSS-REFERENCE TO RELATED APPLICATION

This application is the U.S. national phase of PCT Application No. PCT/EP2013/052435 filed on Feb. 7, 2013, which claims priority to DE Patent Application No. 10 2012 202 089.6 filed Feb. 13, 2012, AT Patent Application No. GM 186/2012 filed Apr. 27, 2012, DE Patent Application No. 20 2012 011 948.6 filed Dec. 13, 2012, and DE Patent Application No. 10 2012 223 039.4 filed Dec. 13, 2012, the disclosures of which are incorporated in their entirety by reference herein.

The present invention relates to an LED module having a carrier and at least one LED chip.

LED modules of the type mentioned in the introduction are known from the prior art. In this regard, e.g. US 2011/0248287 A1 discloses an LED module having a highly reflective carrier. In this respect, the carrier is provided with a reflective layer or coating in regions in which no LED chips are present. Since the reflective layer does not reflect the entire light, a reduction of the efficiency of the module occurs.

Furthermore, US 2011/0001148 A1 discloses an LED module having a plurality of layers, wherein LED chips are placed onto an electrically insulating layer by means of a thermally conductive adhesive, said electrically insulating layer in turn being provided on a carrier. Electrical contact is made with the LED chips and they are subsequently provided with a layer composed of a highly reflective material. A scattering layer and a phosphor layer are subsequently applied thereabove. Disadvantages here include, firstly, the reflectance of the reflective layer and, secondly, the complex construction of the module.

Therefore, it is an object of the invention to provide a simple LED module which enables a high reflectance of the carrier and at the same time has an improved heat dissipation.

This object is achieved by means of the features of the independent claims. The dependent claims develop the central concept of the invention in a particularly advantageous manner.

In accordance with a first aspect of the invention, an LED module is proposed which comprises a carrier, e.g. a printed circuit board, wherein a metallic layer is applied on the carrier. Preferably, the LED module comprises at least one LED chip and a lacquer layer composed of a ceramic lacquer, said lacquer layer at least partly covering the metallic layer and being applied on the carrier. The LED chip (or the SMD LED) can be fixed e.g. on the printed circuit board or the metallic layer (or the lacquer layer) in accordance with chip-on-board (COB) technology. The use of SMD (surface-mounted device) technology is alternatively conceivable as well.

According to the invention, the light from the LED chip that passes through the lacquer layer can be reflected back on account of the underlying metallic layer. This doubly reflective configuration of lacquer layer/metal layer has the advantage that, for example, in the case of oxidative blackening of the metal layer (e.g. silver layer), a significant proportion of the light is still reflected by the overlying lacquer layer, which increases the efficiency of the module. At the same time, the thermal conductivity of the module is improved by the use of the metal layer according to the invention.

Preferably, the LED chip is applied on the metallic layer. The lacquer layer is then applied in regions on the metallic layer outside the LED chip. Consequently, the lacquer layer has clearances into which the LED chips can be inserted and applied to the metallic layer.

The LED chip can be adhesively bonded onto the metallic layer by means of an adhesive. The adhesive can be, for example, a transparent translucent adhesive or a reflective, that is to say in particular white, adhesive. Preferably, the adhesive at least partly or completely fills a gap between the side wall of the LED chip and an edge boundary of the ceramic lacquer layer facing the LED chip, such that the metal layer (e.g. silver layer) is completely covered in the last-mentioned case. If the adhesive is composed of a light-reflecting material, then the entire carrier surface can be embodied with a doubly reflective configuration.

The distance between the side wall of the LED chip and the lacquer layer is preferably in a range of between 50 and 500 µm, particularly preferably between 100 and 300 µm.

The lacquer layer can have an average thickness of 10 to 100 µm, preferably an average thickness of 20 to 50 µm.

The metallic layer can have a thickness of 30 to 8000 nm, preferably a thickness of 100 to 300 nm or 2000 to 6000 nm. In the case of a silver layer, the latter preferably has a thickness or average thickness of 3000 to 5000 nm. In the case of a gold layer, the latter preferably has a thickness or average thickness of 30 to 100 nm.

The LED module can furthermore comprise a dam which laterally surrounds the LED chip or a plurality of LED chips and preferably projects beyond the LED chips in terms of height and is at least partly applied on the metallic layer and/or the lacquer layer.

Preferably, the LED module furthermore comprises a central filling composed of a matrix material. The matrix material can be a transparent and preferably liquid and thermally curable polymer; e.g. silicone. The central filling preferably (completely) fills the space surrounding by the dam. Particularly preferably, the top side of the LED chip is covered or coated in this case.

The central filling can thus fill the entire volume delimited by the dam, such that the top side of the filling is on the same plane as the maximum height of the dam. Preferably, the dam, that is to say the upper edge of the dam, is higher than the LED chip (i.e. the upper edge thereof), such that the top side of the LED chip is then coated or covered and protected by the filling.

The central filling can comprise color conversion particles/phosphor particles which alters light emitted by an LED chip into light in a second, lower frequency spectrum. Alternatively or additionally, the central filling can comprise scattering particles which scatters light emitted by an LED chip in order thereby to enable a more homogeneous emission.

The material of the dam and the material of the central filling can be of the same material class, preferably on the basis of silicone. Particularly preferably, the dam and the central filling are produced from a polymer or resin with the same structure, thereby enabling the dam and the filling both to be applied and cured in one curing step. Particularly preferably, the material or the polymer of the dam and that of the central filling have a similar chemical structure which preferably allows a crosslinking between the materials. They can also be polymerized by the same reaction and differ only in the resulting Shore hardness, e.g. a Shore A hardness of 70 for the dam and a Shore A hardness of 35 for the filling.

They can also be produced from an identical material which results in a different functional embodiment e.g. only by virtue of the fillers used.

As described above, the dam can also be produced form a resin or a polymer material. Different base resins can be used for the dam. Preferred materials are silicones, on account of their high UV stability. The material of the dam can comprise fillers in the form of particulate material such as e.g. pyrogenic silicic acid (silicon dioxide; SiO2), wherein particulate material or finely granulated material can be used in order to determine the desired rheological properties of the uncured polymer. The dam material is preferably non-transparent (or highly reflective) for the wavelength of the light which penetrates through the central filling within the dam. A transparent or translucent embodiment of the dam is conceivable in accordance with an alternative embodiment of the invention.

At least the inner wall of the dam can be light-reflecting/scattering. Particularly preferably, the dam comprises light-scattering particles, such as, for example, white pigments (e.g. SiO2, TiO2, BaTiO3, SnO, ZrO2). These reflective/scattering particles are preferably situated throughout the mass of the dam. As a result, the dam has the role of a reflector applied to a (printed circuit) board in a liquid state. The dam can contain 10 to 60 percent by weight, particularly preferably 20 to 40 percent by weight, of the reflective particles.

The dam can be a prefabricated element, preferably composed of polymer (e.g. filled polymer/resin), ceramic, metal or some other (preferably filled) plastic.

The dam can have a height of 0.1 mm to 3 mm, preferably 0.25 to 2 mm, particularly preferably 0.5 to 1 mm.

The diameter of the cross-sectional area of the dam, that is to say the average thickness of the dam or the maximum distance between the inner wall and the outer wall of the dam, can be chosen in accordance with the requirements of the final element. Preferably, the thickness substantially corresponds to the height of the dam. Given a total diameter of the dam of approximately 5 mm, the thickness thereof can be less than or equal to 0.5 mm. For larger diameters, the thickness is correspondingly adjusted to more than 0.5 mm, and with smaller diameters the thickness can also be less than 0.5 mm.

The cross-sectional shape of the dam is not restricted by the invention.

The dam can have in plan view, that is to say as seen perpendicularly to the carrier or the printed circuit board, a circular, ellipsoidal, oval, or angular or polygonal shape, for example a rectangular or square or octagonal shape.

The invention furthermore relates to a spotlight, a downlight or a retrofit LED lamp comprising at least one LED module according to the invention.

The invention also relates to an LED module which is producible by a method for producing an LED module. Firstly, a metallic layer, preferably a silver layer or a gold layer, is applied to a carrier, in particular a printed circuit board. In this case, the layer thickness can be increased by a plurality of coating steps or coating processes being carried out successively.

The reflective metal layer, in particular a silver surface, can additionally be protected against oxidation by coating with titanium oxide, aluminum oxide or glass. In this case, the white lacquer serves primarily for optimizing the light output.

A ceramic lacquer is then applied to the carrier—more precisely the metallic layer of the carrier—in such a way that said layer (carrier) is at least partly, preferably completely, covered by a lacquer layer. If the metallic layer is covered only partly, that is to say partially, the lacquer layer thus has clearances wherever there is no lacquer. Preferably, the lacquer layer is printed on, for example by means of screen printing methods.

Afterward (or else before, during or after one of the abovementioned steps), at least one LED chip is positioned on the carrier, the metallic layer or the lacquer layer.

If clearances are present, the LED chip is preferably adhesively bonded onto the metallic layer in the clearances of the lacquer layer. This is preferably carried out by means of a reflective, particularly preferably white, adhesive. The metering of the adhesive is preferably chosen in such a way that when the LED chip is positioned onto the adhesive in the clearances, the adhesive is laterally displaced in such a way that it at least partly or completely fills the remaining gap between the side wall of the LED chip and an edge boundary of the ceramic lacquer layer facing the LED chip, such that the metallic layer is completely covered in the last-mentioned case.

There is furthermore the possibility of applying a dam at least partly on the metallic layer and/or the lacquer layer in such a way that the dam laterally surrounds the at least one LED chip. After that, the space surrounding by the dam is filled with a filling material for forming a central filling. The resulting central filling is preferably provided in such a way that it coats the top side of the LED chip.

The dam and the central filling are preferably produced from a liquid polymer or a liquid polymer mixture which is cured after the applying and filling, respectively. The curing of the dam and the curing of the central filling can be carried out after the respective steps applying the dam and the central filling. It is alternatively also possible and particularly preferred to carry out the curing of the two parts in an individual step after providing the dam and the central filling. In this case, a chemically and/or physically bonded interface can be produced between the dam and the central filling. If the same base polymer is used, an interface cannot actually arise as such.

Aspects of the invention include, in particular:
An LED module, comprising:
a carrier having a high reflectance, wherein a metallic layer, preferably a silver layer or a layer composed of ultrapure aluminum, is applied on the carrier.

The LED module can comprise an oxide layer above the metallic layer.

A lacquer layer can be provided above the metallic layer and, if appropriate, the oxide layer.

The LED module can comprise an LED chip on the metallic layer, the oxide layer or the lacquer layer.

The metallic layer can consist of a bondable surface or surface that is bondable at least in partial regions, and wherein said surface, in the non-bondable surface regions, is additionally protected against alteration by oxides or organic layer(s).

The metallic layer can additionally be protected against alteration by oxides or organic layer(s).

The LED module can be configured in such a way that at least part of light incident on the module, e.g. from an LED chip that can be fitted on the module, is reflected by the metal layer.

An LED module can comprise:
a carrier having a high reflectance, wherein a metallic layer, preferably a silver layer or a layer composed of ultrapure aluminum, is applied on the carrier,
an oxide layer above the metallic layer, wherein a lacquer layer is provided above the metallic layer and, if appropriate, the oxide layer, furthermore optionally an LED chip on the metallic layer, the oxide layer or the lacquer layer, wherein the LED module is configured in such a way that at least part of light incident on the module, e.g. from an LED chip that can be fitted on the module, is reflected by the metal layer.

An LED module can comprise:
- a carrier having a high reflectance, wherein a metallic layer is applied on the carrier,
- at least one LED chip, and
- a dam,
- wherein the metallic layer partly covers the surface of the carrier that lies below the dam.

The LED module can comprise a lacquer layer, which is partly applied on the metallic layer.

The LED chip can be applied on the metallic layer and/or on the lacquer layer and/or directly on the carrier.

The lacquer layer can have an average thickness of 5 to 250 μm, preferably 10 to 100 μm, preferably 20 to 50 μm.

The metallic layer can have a thickness of 30 nm to 8000 nm, preferably a thickness of 100 nm to 300 nm or 2000 nm to 6000 nm.

The lacquer layer can be positioned on the metallic layer and completely cover the space surrounding by the dam and/or project as far as the surface of the carrier below the dam, and the carrier exhibits at least one region not covered by the lacquer layer.

The carrier can comprise a printed circuit board and/or a base substrate.

The printed circuit board and the base substrate can be connected with the aid of an additional substrate e.g. by an adhesive-bonding process.

The base substrate can have a thickness of 0.5 to 5 mm, preferably 1-1.5 mm, with further preference 1.5 to 2 mm.

The printed circuit board can preferably have at least one cutout (i.e. excision or depression) in a region in which the LED chips are provided.

So-called mid- and/or low-power LED chips can be mounted within a dam in a manner connected in series and structured in strings.

In this case, a string can contain 5-26 LED chips, more preferably 8-20 LED chips, particularly preferably 10-15 LED chips.

The LED chips can preferably be set up in 1-15 strings, more preferably in 3-12 strings on the LED module.

The LED module can preferably be equipped with from 10 to 370 LED chips, particularly preferably with from 20 to 120 LED chips, uniformly at a small distance from one another.

The LED module can furthermore comprise a reflector and an additional substrate.

The dam can laterally surround the LED chip or a plurality of LED chips and preferably in terms of height project beyond the LED chips, which are at least partly applied on the metallic layer and/or the lacquer layer, and preferably furthermore comprise a central filling composed of a matrix material, preferably a transparent and preferably liquid and thermally curable polymer or a polymer mixture, wherein the central filling preferably completely fills the space surrounding by the dam, such that the top side of the LED chip is coated.

The central filling can comprise color conversion particles and/or scattering particles.

The material of the dam and the material of the central filling can be of the same material class, preferably on the basis of silicone, particularly preferably the dam and the central filling are produced from a polymer or resin with the same structure, thereby enabling the dam and the filling both to be cured in one curing step.

The material of the dam can comprise fillers in the form of particulate material such as e.g. silicon dioxide.

At least the inner wall of the dam can be light-reflecting or scattering, and/or the dam can comprise reflective or light-scattering particles, preferably white pigments.

The dam can be a prefabricated element, preferably composed of a polymer, ceramic, metal or plastic.

The dam can have a height of 0.1 to 3 mm, preferably of 0.25 to 2 mm, particularly preferably of 0.5 mm to 0.8 mm. The diameter of the cross-sectional area of the dam, that is to say the average thickness of the dam or the maximum distance between the inner wall and the outer wall of the dam, preferably substantially corresponds to the height of the dam.

The dam in plan view, that is to say as seen perpendicularly to the carrier, can have a circular, ellipsoidal, oval or angular shape, for example a rectangular or square or polygonal shape.

A spotlight or a retrofit LED lamp comprises at least one LED module of the abovementioned type, preferably furthermore comprising one or more of:
- a housing,
- a reflector,
- a driver circuit,
- a sensor system,
- a heat sink and/or
- a lamp base.

An LED module having a carrier having a high reflectance is producible by a method comprising the following steps:
- applying a metallic layer to a carrier,
- applying a ceramic lacquer to the carrier in such a way that the metallic layer of the carrier is partly covered by a lacquer layer,
- positioning at least one LED chip on the carrier, the metallic layer or the lacquer layer.

The LED module can furthermore be producible by a method which furthermore comprises the following steps:
- applying a dam at least partly on the metallic layer and/or the lacquer layer in such a way that the dam laterally surrounds the at least one LED chip,
- filling the space surrounding by the dam with a filling material, wherein the central filling that arises in this way is preferably provided in such a way that it coats the top side of the LED chip, wherein the dam and the central filling are preferably produced from a liquid polymer or a polymer mixture which is cured after the applying and filling, respectively, and wherein the curing of the dam and the curing of the central filling are carried out after the respective steps or providing the dam and the central filling, or in an individual step after providing the dam and the central filling, wherein in the latter case a chemically and/or physically bonded interface is preferably produced between the dam and the central filling.

The LED module can furthermore be producible by a method which furthermore comprises the steps that a plurality of steps for applying the ceramic lacquer to the metallic layer are provided, such that the layer thickness of the lacquer layer is increased.

The LED module can furthermore be producible by a method which furthermore comprises the steps that the ceramic lacquer is printed onto the metallic layer, preferably by means of a screen printing method or a dispensing method.

The LED module can furthermore be producible by a method which furthermore comprises the steps wherein the ceramic lacquer is applied to the metallic layer in such a way that the latter is only partially covered by the lacquer layer and has clearances, wherein the LED chip is adhesively bonded onto the metallic layer preferably in the clearances of the lacquer layer preferably using a reflective, particularly preferably white, adhesive, and wherein the metering of the adhesive is preferably chosen in such a way that when the LED chip is positioned onto the adhesive in the clearances, the adhesive is laterally displaced in such a way that it at least partly or completely fills the remaining gap between the side wall of the LED chip and an edge boundary of the ceramic lacquer layer facing the LED chip, such that the metallic layer is completely covered in the last-mentioned case.

Further aspects, advantages and objects of the present invention will become apparent from the following detailed description of an exemplary embodiment of the present invention if they are related to the accompanying drawings.

Figure 1B:
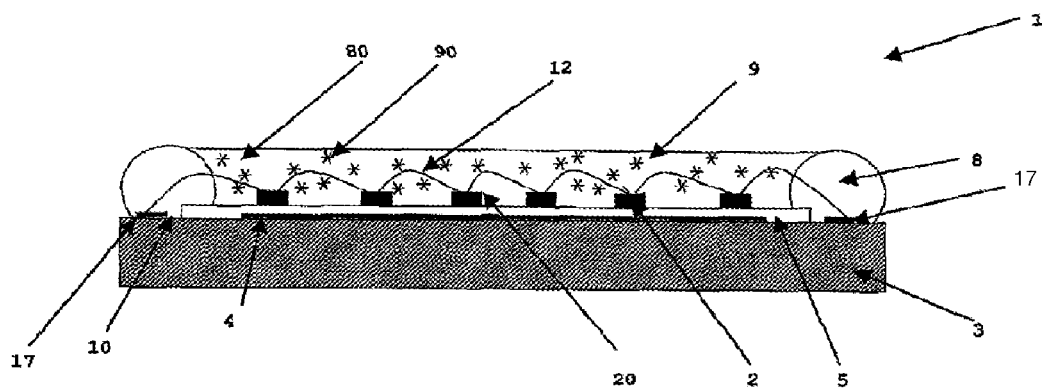
Figure 1C:
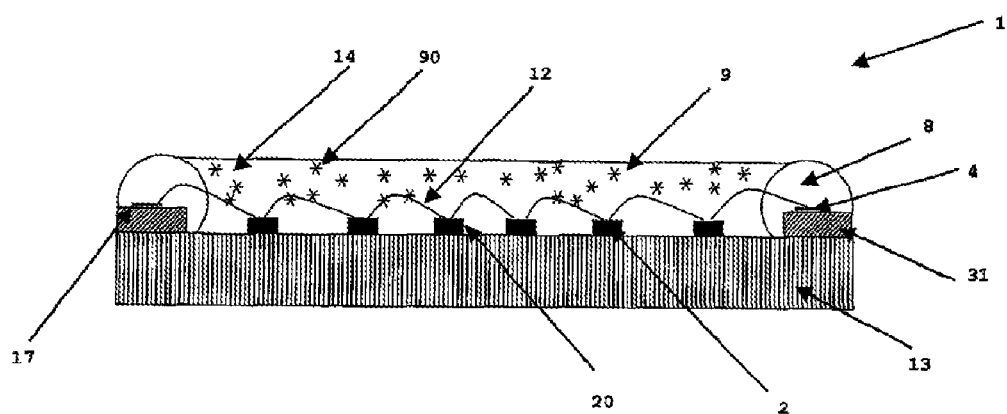
Figure 1D:
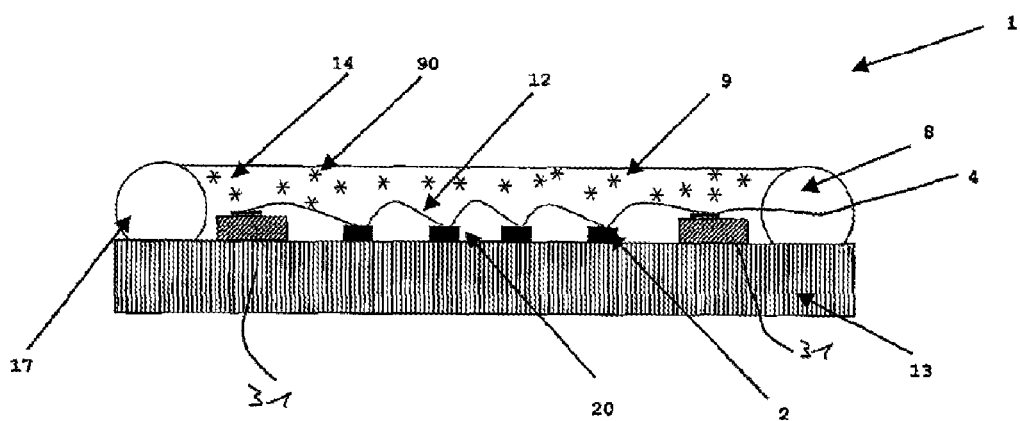
Figure 2A:
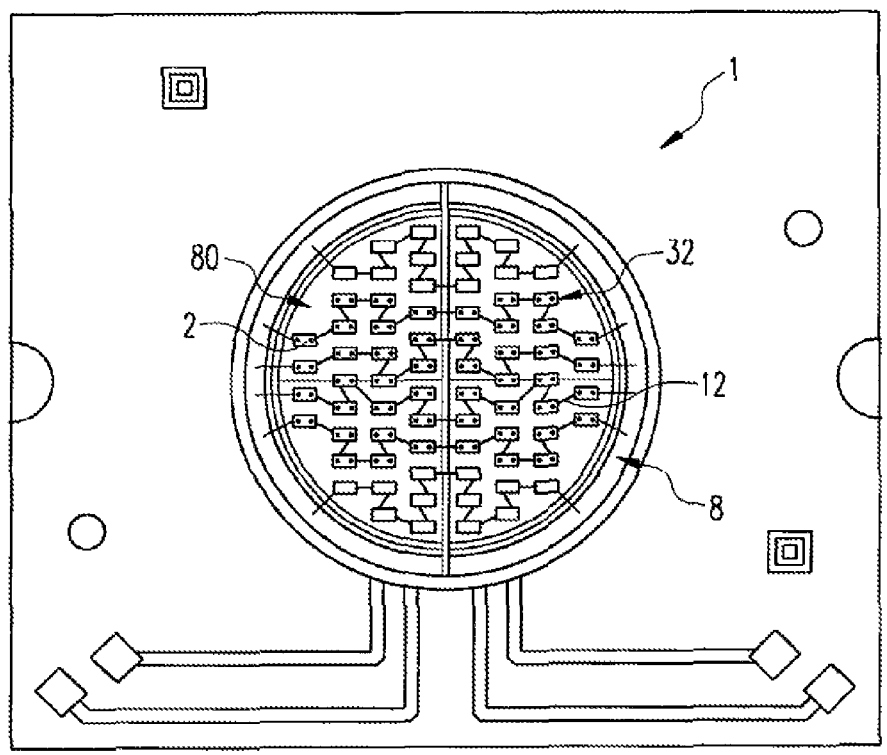
Figure 2B:
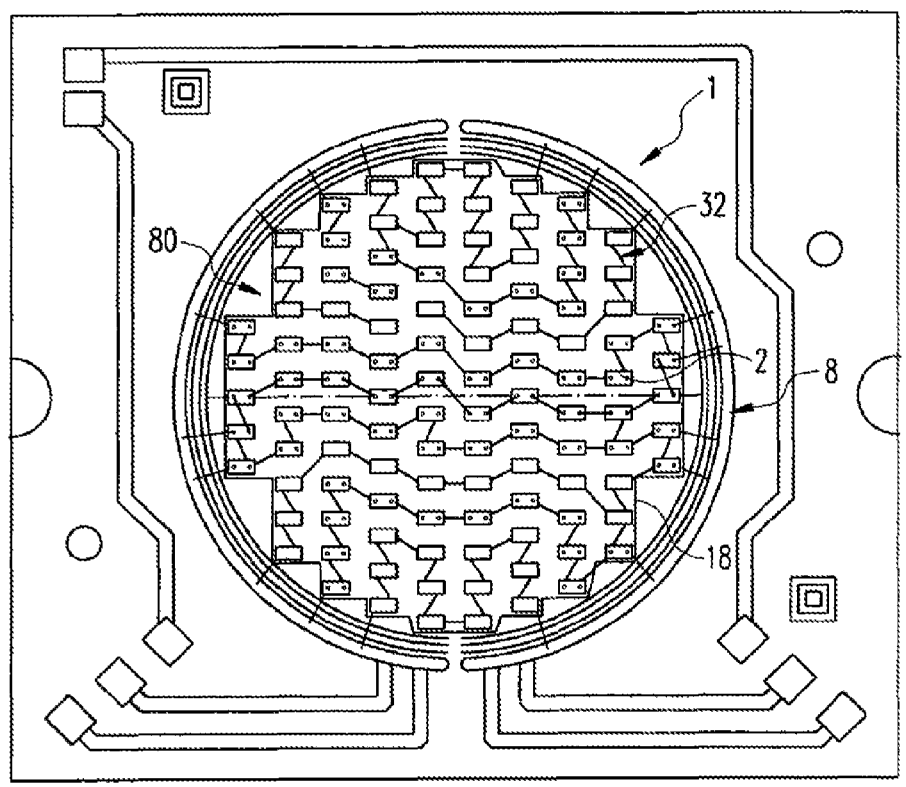
Figure 2C:
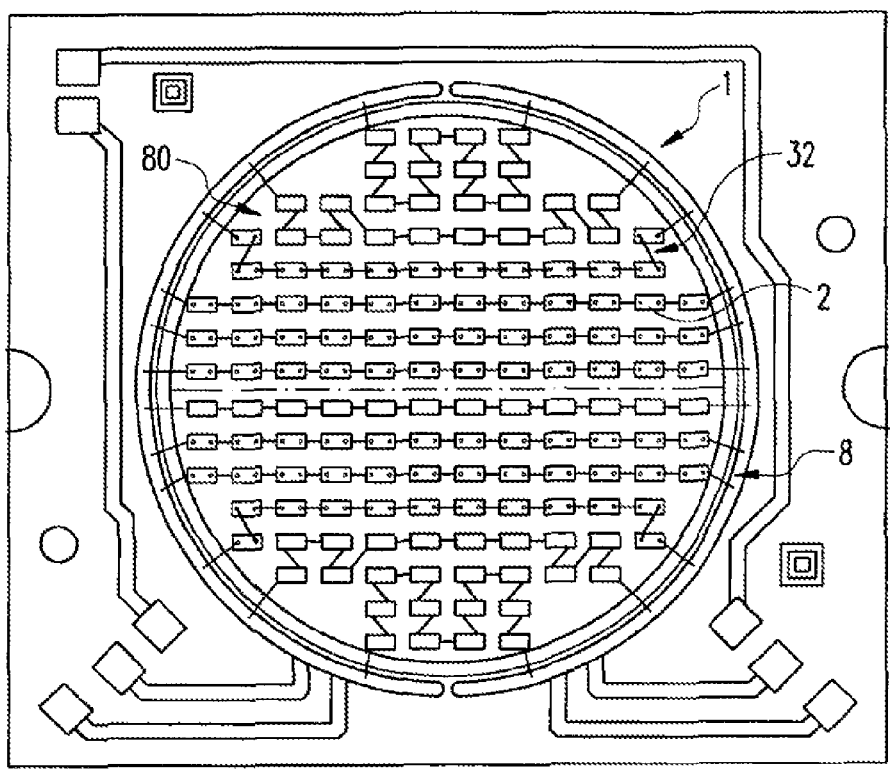
Figure 3:
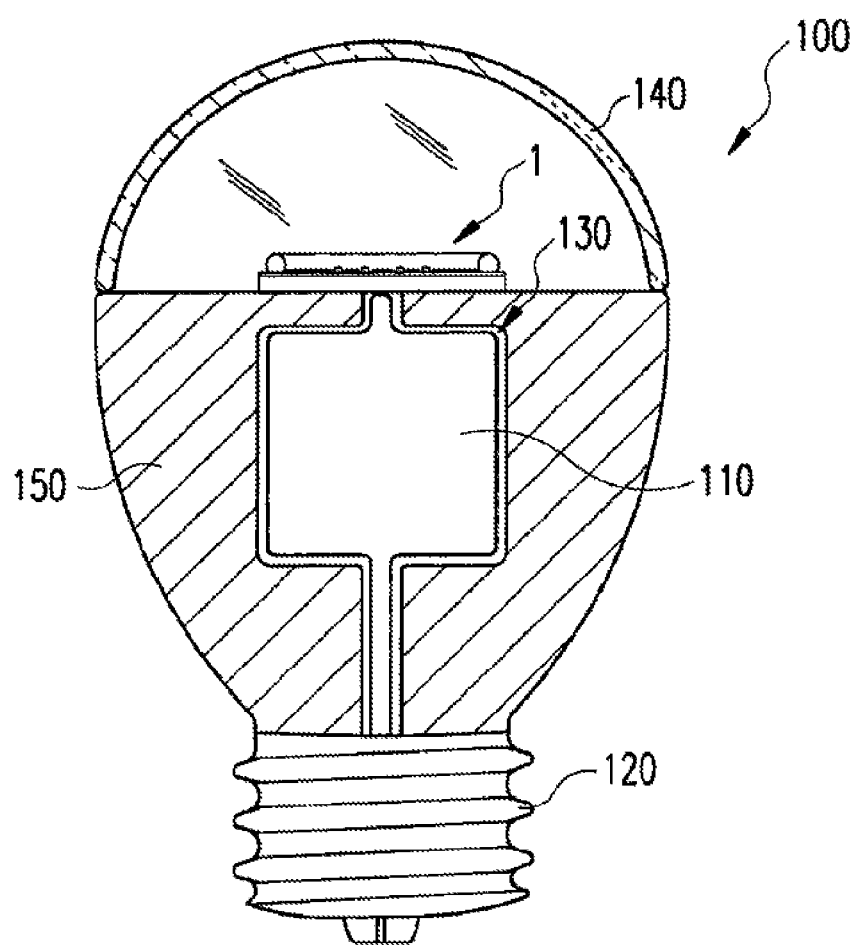
Figure 4:
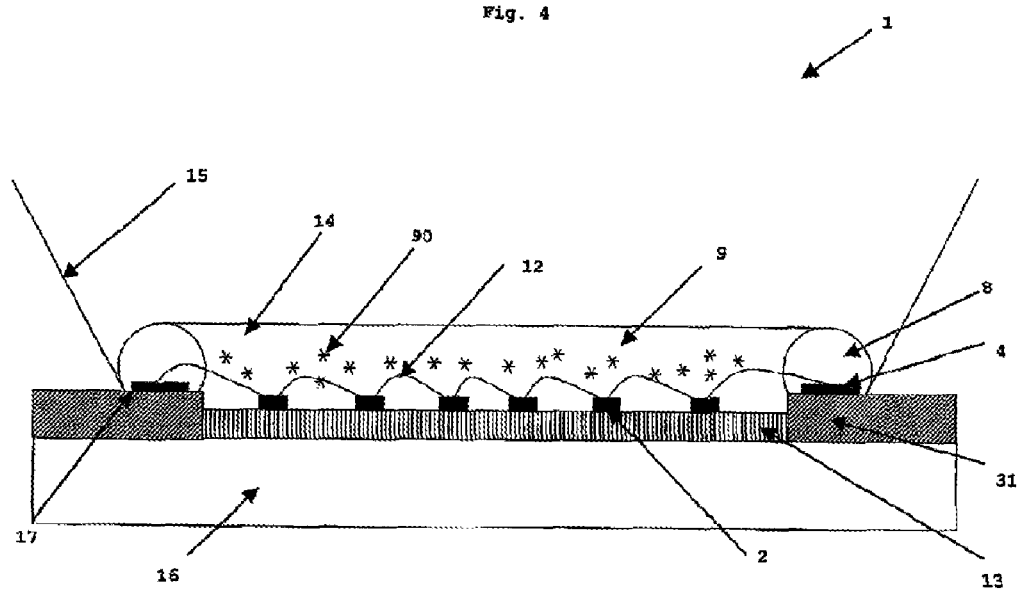

FIG. 1A shows a sectional view of an LED module in accordance with the first embodiment of the invention, FIG. 1B shows a sectional view of an LED module in accordance with the second embodiment of the invention, FIG. 1C shows a sectional view of an LED module in accordance with the third embodiment of the invention, FIG. 1D shows a sectional view of an LED module in accordance with the fourth embodiment of the invention, FIGS. 2A-C show the overviews of the LED modules according to the invention, FIG. 3 shows a partial sectional view of a retrofit LED lamp comprising an LED module according to the invention, and FIG. 4 shows a sectional view of an LED module in accordance with a further embodiment of the invention.

FIG. 1A shows an LED module 1 (also called module hereinafter) in accordance with one embodiment of the invention. The module 1 comprises at least one light-emitting diode (LED die or LED chip) 2. The number of LED chips 2 is not limited by the invention. The LED chip 2 preferably has a height of 50 to 500 μm, preferably 100 to 200 μm.

The LED chips 2 are applied on the carrier 3. As LED chips 2 it is possible to use amber, red, green, and/or blue LED chips 2 (e.g. RGB) or blue and red LEDs for generating monochromatic, white or different-colored, mixed light. Furthermore, the LED chip 2 can be provided with a photoluminescent material arranged above the LED chip 2, such as, for example, inorganic phosphor(s) (for example garnets: YAG: $Ce^{3+}$, LuAG: $Ce^{3+}$; orthosilicates (BOSE): $(Ca, Sr, Ba)_2SiO_4:Eu^{2+}$, $(Ca, Sr)_2SiO_4:Eu^{2+}$, $(Sr, Ba)_2SiO_4: Eu^{2+}$, $(Ca, Ba)_2SiO_4:Eu^{2+}$; nitrides: $CaAlSiN_3: Eu^{2+}$, $(Sr, Ca)AlSiN_3: Eu^{2+}$, $CaAlSiON_3: Eu^{2+}$, $\beta\text{-}SiAlON: Eu^{2+}$)) and/or organic phosphor(s), by means of which the light emitted by the LED chip 2 and the light converted in the photoluminescent material are mixed with one another in such a way that any desired color or white light (e.g. by means of blue LED and yellow (and/or green and/or red) phosphor) can be generated. Any combination of the above-mentioned LED chips 2 in the LED module 1 is also conceivable.

The module 1 preferably consists of a carrier 3 and a preferably structured metallic layer 4. The carrier 3 is preferably a printed circuit board, wherein the carrier 3 consists of a metal core, preferably of an aluminum board, and an electrically insulating dielectric and structured copper conductor tracks. The metallic layer 4 is applied on the carrier 3; preferably, the carrier 3 is coated with the metallic layer 4. The metallic layer 4 is preferably a silver layer, a gold layer, an ENIG (Electroless Nickel/Immersion Gold), an ENEPIG (Electroless Nickel/Electroless Palladium/Immersion Gold) or an ENEC/OSP (Electroless Ni/Electroless Cu/OSP (Organic Surface Protection)) and preferably covers the entire carrier surface. The metallic layer 4 can consist of a bondable surface or surface that is bondable at least in partial regions 7, wherein said surface, in the non-bondable surface regions 6, can be additionally protected against alteration by an oxide layer or organic layer 22.

The layer 4 preferably has a thickness of 30 to 8000 nm, particularly preferably a thickness of 100 to 300 nm or 2000 to 6000 nm. This upper limit is dictated partly technically, but also as a compromise owing to the costs for the silver or gold material. In other words, thicker coatings are also conceivable according to the invention.

A lacquer layer 5 can be provided for example in a manner made from a highly reflective white paste such that it at least substantially covers the metallic layer 4. For this purpose, the lacquer layer 5 is applied on the carrier 3, more precisely the metallic layer 4 of the carrier 3; preferably by means of a dispensing method or a screen printing method. In this embodiment, the lacquer layer 5 preferably has a thickness or average thickness of 5 to 250 μm, more preferably 20 to 200 μm, particularly preferably 100 to 150 μm.

The lacquer layer 5 can be realized as a (highly) reflective ceramic white layer or as a white (highly) reflective coating. The lacquer layer 5 is preferably a white coating contains preferably pigments composed of titanium dioxide (a polymorph of $TiO_2$, e.g. $TiO_2(B)$), aluminum oxide ($Al_2O_3$), zirconium dioxide ($ZrO_2$), barium titanate ($BaTiO_3$), silicon dioxide ($SiO_2$), or potassium octatitanate ($K_2Ti_8O_{17}$). The pigments preferably consist of a mixture of $TiO_2$ and/or $TiO_2(B)$ and/or $K_2Ti_8O_{17}$ and/or $SiO_2$. The dispersion furthermore preferably comprises an organic solvent (e.g. ether(s), branched polymeric siloxane(s), preferably methyl and/or hydroxy terminated silsesquioxanes) and/or an inorganic solvent, e.g. water. The use of a mixture of organic and inorganic solvents can also be implemented.

In one preferred embodiment, the at least one LED chip 2 is directly applied on the metallic layer 4 (if appropriate with protective coating described above), and electrically contact-connected (e.g. in a cutout of a (FR4) printed circuit board). For this purpose, the LED chip 2 can be fixed in conformity with chip-on-board (COB) technology. However, the LED chip 2 can also be applied on the carrier 3 or the lacquer layer 5 (as in FIGS. 1B, 1C). If the LED chip 2 is applied on the metallic layer 4, then the lacquer layer 5 is applied only in regions on the metallic layer 4 outside the LED chip 2. The lacquer layer 5 is then preferably applied to the metallic layer 4 before the LED chips 2 are applied to the metallic layer 4. As will be described below, for this purpose the lacquer layer 5 is provided in such a way that clearances 6 remain. In said clearances 6, the LED chip 2 is applied to the metallic layer 4.

The distance between the side wall 20 of the LED chip 2 and the lacquer layer 5 (that is to say an edge boundary 50 of the lacquer layer 5 which is defined by the clearance 6) is preferably in a range of between 50 and 500 μm, particularly preferably between 100 and 300 μm.

The LED chip 2 is preferably adhesively bonded onto the metallic layer 4 by means of an adhesive (not shown). The adhesive can be a reflective, preferably white, adhesive. In one preferred embodiment, the adhesive at least partly or completely fills a gap 7 between the side wall 20 of the LED chip 2 and an edge boundary 50 of the ceramic lacquer layer 5 facing the LED chip 2, such that the metallic layer 4 in the last-mentioned case is completely covered by the lacquer layer 5, the LED chips 2 and the adhesive. In a further preferred application, the adhesive is transparent.

The module 1 can furthermore comprise a dam 8 laterally surrounding the LED chip 2 or the plurality of LED chips 2, said dam being at least partly applied on the metallic layer 4 and/or the lacquer layer 5. The dam 8 is preferably provided in a manner spaced apart laterally from the LED chip 2.

Preferably, a central filling 9 fills the space 80 surrounding by the dam 8. Preferably, the central filling 9 fills the entire volume delimited by the dam 8; the inner space 80 formed by the dam 8 is thus filled with the filling 9 preferably as far as the highest extent of the dam 8. If the dam 8 in accordance with one preferred configuration is embodied such that it is higher than the LED chip 2 and thus projects beyond the latter in terms of height, then the top side 21 of the LED chip 2 can be covered or coated with the filling material; at least if the volume delimited by the dam 8 is completely filled with the central filling 9. Preferably, the height of the dam 8 is at least two or three times as high as the height of the LED chip 2. The dam 8 preferably has a height of 0.1 to 3 mm, particularly preferably 0.25 to 2 mm, extremely preferably 0.5 to 1 mm. The diameter of the cross-sectional area of the dam 8, that is to say the average thickness of the dam 8 or the maximum distance between the inner wall and the outer wall of the dam 8, substantially corresponds to the height of the dam 8.

The central filling 9 is preferably produced from a matrix material, particularly preferably composed of a transparent, preferably liquid and thermally curable polymer or resin or a polymer mixture. Preferably, the central filling 9 comprises color conversion particles and/or scattering particles 90.

In one particularly preferred configurational form, the material of the dam 8 and the material of the central filling 9 are of the same material class, preferably on the basis of silicone. The dam 8 and the central filling 9 can be produced e.g. from a polymer with the same structure. This enables the dam 8 and the filling 9 both to be applied in one curing step, as will be described below.

The rheological characteristics of the liquid polymer material for constructing the wall of the dam 8 must be selected in such a way that the uncured polymer or resin is dimensionally stable after being administered until curing. This approximately solid-like state can be achieved by appropriate admixture of suitable fillers.

In order to control the rheological characteristics of the liquid polymer or resin material, pyrogenic silicic acid (silicon dioxide; $SiO_2$) or other particulate materials (finely granulated materials) can be added as fillers to the liquid polymer or resin. The dam material is preferably reflective for the wavelength of the light which penetrates through the central filling 9 within the dam 8.

If a higher reflectivity of the wall of the dam 8 is desired, for example at least the inner wall of the dam can be coated with metal or the dam can be produced from metal. In this embodiment, however, insulation problems can occur.

Particularly preferably, the dam 8 alternatively or additionally comprises (highly) reflective and/or effectively scattering particles having low absorption, such as white pigments, for example. For this purpose, the reflective materials can be added to the liquid polymer or resin. Such pigments are produced e.g. from $TiO_2$, $BaTiO_2$, $BaSO_4$ and/or $ZrO_2$. Said reflective particles are preferably situated throughout the mass of the dam 8. The dam 8 can contain 10 to 60 percent by weight of the reflective particles. As a result, the entire material of the dam 8 will have a non-transparent and preferably white appearance. The reflection of light by the LED chip 2 takes place at the inner surface of the dam 8, whereby light is reflected back into the interior of the dam 8 and away from the LED chip 2. As a result, the dam 8 has the role of a reflector applied in a liquid state on the carrier 3 and/or the metallic layer 4 and/or the lacquer layer 5.

The dam 8 can be applied by means of dispensing techniques, as will be described below. However, it is also possible for the dam 8 to be a prefabricated element, preferably composed of a polymer, ceramic, metal or some other plastic. This element can then be adhesively bonded e.g. at the envisaged location.

The dam 8 preferably has the cross-sectional shape of a semicircle, a circle, a rectangle or a square or a polygon. In plan view, that is to say as seen perpendicularly to the carrier 3, the dam 8 has a circular, oval, ellipsoidal or angular shape, for example a rectangular or square or polygonal shape. It should be emphasized at this juncture that the term "dam" does not constitute any restriction with regard to the shape as long as the dam 8 can serve as a dam 8 surrounding the inner, central filling 9, and, if the dam 8 is composed of a polymer or resin material, it is stable even in the uncured state.

FIG. 1B illustrates a second embodiment of the invention. In comparison with the solution in FIG. 1A, the metal layer 4 only partly covers the carrier 3; preferably, the regions below the LED chips 2 and the bonding pads 11 (not shown) are coated with the metal layer 4. This results in the regions 10 not covered by metal layer 4 on the carrier 3. The lacquer layer 5 covers the metal layer 4 underneath the LED chips 2, but not the metal layer 4 applied on the bonding pads 11. The lacquer layer 5 extends as far as the carrier surface 17 below the dam 8. The lacquer layer 5 preferably completely covers the surface of the carrier 3 below the dam 8. However, the lacquer layer can be applied incompletely to the carrier region below the dam 8.

In this embodiment, the lacquer layer 5 preferably has a thickness or average thickness of 10 to 100 µm, particularly preferably 20 to 50 µm. In this embodiment, the LED chips 2 lie directly on the lacquer layer 5. The LED chips 2 are electronically connected to one another and to the bonding pads 11 by means of bonding wires 12. The band wires 12 are partly mechanically protected by the dam 8 because they lie partly below the dam 8.

By way of example, the carrier 3 with layer 4, in addition to the examples mentioned, can also be constructed as follows according to FIG. 1C (third exemplary embodiment), wherein the construction described below can also be used by itself, that is to say without the further features described in the context of the application, as an advantageous (highly) reflective printed circuit board in the same or other fields of printed circuit board technology. Firstly, a basic material or base substrate 13 (e.g. aluminum board or gold board) is provided, having e.g. a thickness of 0.5 to 5 mm, preferably 1-1.5 mm. At least one layer composed of ultrapure aluminum (99.99%) is applied, preferably vapor-deposited, onto the base substrate 13. This layer preferably has a thickness of 30 to 8000 nm. This ultrapure aluminum layer can preferably be provided once again, in the manner described above, with at least one layer composed of oxides, which is likewise preferably vapor-deposited.

Finally, the fourth exemplary embodiment in FIG. 1D illustrates a modification of the third exemplary embodiment according to FIG. 1C. In this exemplary embodiment, the printed circuit board 31 and the layer are arranged partly or preferably completely (as illustrated) within the dam 8, such that the dam 8 does not cover (as illustrated) these components or only partly covers them. As illustrated, preferably each bonding wire 12, than in particular also the one lying closest to the dam 8, runs completely within the volume outwardly delimited by the dam 8. Therefore, the dam 8 is preferably seated directly and completely on the base substrate 13.

A printed circuit board 31, preferably an FR4 printed circuit board is applied, more precisely pressed or laminated, onto the abovementioned construction. Base substrate 13 and printed circuit board 31 form the carrier 3 in the embodiments shown in FIGS. 1B-1C and FIG. 4.

Alternatively, the printed circuit board 31 and the base substrate 13 can be connected with the aid of an additional substrate 16 e.g. by an adhesive-bonding process or soldering method (see FIG. 4).

Preferably, the electrically insulating base or carrier material (generally epoxy resin impregnated glass fiber mats) of the printed circuit board 31 has a thickness of 30 to 300 μm, particularly preferably 100 μm. The copper layer (conductor tracks) applied on the carrier material of the (FR4) printed circuit board 31 preferably has a thickness of 18 to 140 μm, particularly preferably of 60 to 90 μm. The finishing surface/metal layer 4 consists of nickel and/or palladium and/or gold (as mentioned earlier, e.g. ENIG, ENEPIG or ENEC/OSP). The metal layer 4 is preferably applied to the surface of the (FR4) printed circuit board 31 (of the carrier 3) below the dam 8. The soldering mask is preferably white.

The printed circuit board 31 furthermore preferably has at least one cutout 14 (e.g. filled hole, milled hole, etc.) in a region in which the LED chip or LED chips 2 is/are provided. Said cutout(s) 14 expose(s) the underlying aluminum layer or coated aluminum board (or gold layer) and constitute(s) a reflective surface on the (coated) base substrate 13. In the region of the cutout(s) 14, the LED chip 2 or the LED chips 2, in the manner described below, can be applied directly to the base substrate 13 (if appropriate with above-described protective coating composed of oxides). Such a construction alone makes it possible to provide a carrier 3 or a printed circuit board which enables a high robustness (and thus a certain indestructibility), of the structure. At the same time, the problems that occur as a result of the use of silver—including comparatively high costs of silver—are avoided.

A lacquer layer 5 composed of a ceramic lacquer or a ceramic highly reflective white paste can be provided according to a further embodiment in such a way that it at least partly covers the base substrate 13. For this purpose, the lacquer layer 5 can be applied on the base substrate 13; preferably by means of a screen printing method. For this purpose, the lacquer layer 5 can e.g. also be provided particularly in the region of a possible cutout 14 in an (FR4) printed circuit board and, if appropriate, furthermore cover the base substrate 13 and/or the (FR4) printed circuit board 31 (e.g. outside the regions of the coated base substrate that are exposed by a cutout 14 in the FR4 printed circuit board). The lacquer layer 5 preferably has a thickness or average thickness of 10 to 100 μm, particularly preferably 20 to 50 μm.

Alternatively, a reflector 15 can be applied on the printed circuit board 31 outside the dam (see FIG. 4).

According to the invention, mid- and/or low-power (0.05-0.6 W) LED chips 2 can be mounted within the dam 8 (in the space 80 surrounding by the dam) (see FIGS. 2A-C, for example). The use of high-power LED chips 2 is also conceivable on the basis of the examples described. The LED chips 2 are preferably connected in series (in a manner structured in strings 32) (see FIGS. 2A-C). A string 32 preferably contains from 5 to 20 LED chips 2, more preferably 10-14 LED chips 2, particularly preferably 12 LED chips 2. The LED chips 2 are preferably set up in 1-15 strings, more preferably in 6-12 strings, on the LED module 1 in order to obtain the shortest electrical connections between LED chips 2 and the bonding pads 11. The LED module 1 is preferably equipped with from 40 to 160 LED chips 2, in particular preferably from 70 to 150 LED chips 2, e.g. according to the illustrations in FIGS. 2A-C, uniformly and at a small distance from one another, in order to obtain a light distribution that is as homogeneous as possible.

Alternatively, the LED module 1 according to a further embodiment of the invention can contain 10-50 LED chips 2 set up in 1-4 strings.

The surface area 18 (see FIG. 2B, for example) occupied by the LED chips is e.g. from 60% to 90%, preferably 64-75%, of the total surface area of the space 80.

The solutions mentioned have the advantage that when the LED module 1 is used with an optical element (optical elements) (e.g. reflector 15, see FIG. 4) and/or in a luminaire (e.g. downlight, spotlight, LED bulb, see FIG. 3), the homogeneous light distribution/light-emitting area achieved by the uniform placement of the LED chips 2 is not disadvantageously reshaped.

According to the invention, a spotlight or a retrofit LED lamp 100 (see FIG. 3) can be provided, comprising at least one LED module 1 according to the invention. "Retrofit" lamp is understood to mean lamps which, with regard to their mechanical and electrical connections, are designed to replace existing illuminants (incandescent bulb, halogen lamp, . . . ). According to its external appearance, it can substantially have the form of a conventional incandescent bulb or halogen lamp and/or be equipped with a corresponding (lamp) base 120 (e.g. E27 or E14) or plug (not shown). For adapting the supply current, the retrofit LED lamp additionally usually comprises a dedicated driver circuit 110, which, preceding e.g. from a power supply voltage fed in via the base 120, adapts the supply current to the operating conditions of the LEDs. Consequently, the retrofit LED lamps 100, like conventional lamps, can be screwed or inserted into customary lampholders and be operated by means of the power supply current fed in. The driver circuit 110 can be arranged in a mechanically and electrically protected manner in a driver housing 130 as part of a housing. Furthermore, the retrofit LED lamp 100 can have a transparent cover 140 as a further part of the housing, said cover being modeled on a glass envelope of a conventional incandescent bulb or halogen lamp. During the operation of the LED lamp 100, heat is generated by the LED module 1 and also by the driver circuit 110. Said heat is generally dissipated by means of a heat sink 150 (as a further part of the housing) thermally connected to the LED module 1 and the driver circuit 110. Besides the features mentioned above, the LED lamp 100 can also comprise further electrical, electronic and/or mechanical components, such as e.g. a reflector for targeted emission of the light, a sensor system for measuring and controlling the LED module 1 and further known features of a ballast and/or for emitting and/or altering the light.

For spotlights, the geometry of the dam 8 in plan view is preferably circular, other geometries defined by the dam 8 also being possible, such as, for example, rectangular shapes etc. The diameter of the circular dam is preferably from 17 to 28 mm, more preferably from 19 to 26 mm.

A method for producing an LED module 1 according to the invention is described below.

In a first step, a metallic layer 4, preferably a silver layer (or gold layer) having a thickness of approximately 30 to 8000 nm is applied to a carrier 3 (e.g. printed circuit board). Said layer can be provided with a further (protected) layer composed of oxides. Carrier 3 and metallic layer 4 can also consist of a base substrate consisting of aluminum board with vapor-deposited ultrapure aluminum layers and, if appropriate, layers composed of oxides, onto which an (FR4) printed circuit board 31 is laminated, which preferably has cutouts that expose the base substrate 13 at least in places, into which cutouts or onto which base substrate the LED-Chips 2 can then be placed later.

In a second step, a ceramic lacquer ("ink") is applied to the carrier 3—more precisely to the metallic layer 4 of the carrier 3—e.g. by means of a screen printing method. The ceramic lacquer is provided in such a way that the metallic layer 4 of the carrier 3 is at least partly, preferably completely, covered by the lacquer layer 5 that arises. In this case, it is conceivable for this step to be repeated multiply (as often as desired) in order to increase the layer thickness of the lacquer. In the case of a single printing process, the lacquer layer 5 has e.g. a thickness of approximately 15 to 20 µm. The thickness of the lacquer layer 5 can be increased to a range of, for example, 40 to 50 µm or more by means of multiple printing. Increasing the lacquer thickness results in an increase in the reflectance of the lacquer layer 5 from, for example, 80% in the case of 18 µm to approximately 95% in the case of 40 to 50 µm. This reflectance applies in each case when the lacquer layer is measured on a black background.

The light from the LED chip 2 that passes through the lacquer layer 5 can be reflected back on account of the underlying metallic layer or silver layer 4. This doubly reflective configuration has the advantage that, for example, in the case of oxidative blackening of the silver layer 4, a significant proportion of the light is still reflected by the overlying lacquer layer 5, which increases the efficiency of the module 1. Moreover, the lacquer layer 5 can serve as oxidation protection for the metallic layer 4, such that the reflection properties thereof are substantially maintained during the lifetime of the module 1.

The lacquer layer 5 applied to the metallic layer 4 is particularly preferably provided in such a way that the metallic layer 4 is partially covered by the lacquer layer 5. In this context, partially means that the metallic layer 4 is not totally covered by the lacquer layer 5, rather clearances 6 remain, into which later the LED chips 2 are inserted and thus applied to the metallic layer 4. In the case of a construction with an (FR4) printed circuit board laminated onto a coated base substrate, the cutouts in said printed circuit board or the locations of the coated base substrate that are exposed thereby preferably at least partly coincide with the clearances 6 into which the LED chips can preferably be applied to the coated base substrate and thus to the metallic layer 4.

In a third step, at least one or a plurality of LED chip(s) 2 (e.g. four LED chips 2 in FIG. 1) is/are then positioned onto the metallic layer 4 in the clearances 6 of the lacquer layer 5; said LED chip(s) 2 in other words being applied and electrically contact-connected. Preferably, the LED chip 2 is fixed in accordance with chip-on-board (COB) technology or else as SMD LED. The bonding wires 12 are shown in FIGS. 2A-C for example. However, it is also conceivable for the LED chips 2 to be placed onto the lacquer layer 5 if the latter covers the entire metallic layer 4. Moreover, the LED chip 2 can be provided directly on the carrier 3. In this case, the LED chip 2 is preferably applied first to the carrier 3, such that after coating it is laterally surrounded by the metallic layer 4 and the lacquer layer 5; in the emission direction (that is to say, in particular, on its top side 21) the LED chip 2 is then not coated, of course.

The LED chips 2 are preferably adhesively bonded, particularly preferably adhesively bonded onto the metallic layer 4 or base substrate 13. For this purpose, a reflective, preferably white, adhesive can advantageously be used. In accordance with one preferred configuration, the metering of the adhesive should be chosen in such a way that when the LED chip 2 is positioned on the adhesive e.g. in the clearances 6 of the lacquer layer 5, said adhesive is laterally displaced in such a way that it at least partly or completely fills a gap 7 possibly remaining between the side wall 20 of the LED chip 2 and an edge boundary 50 of the ceramic lacquer layer 5/the clearance 6 (if appropriate also the metallic layer 4) facing the LED chip 2, such that the metallic layer 4 (and, if appropriate, also the laminated (FR4) printed circuit board) is completely covered in the last-mentioned case. A doubly reflective configuration can thus be obtained even in regions near the LED chip 2 and over the entire area of the module 1 or carrier 3.

In an optional fourth step, a dam 8 is applied or provided at least partly on the metallic layer 4 (if appropriate including a laminated (FR4) printed circuit board possibly present) and/or the lacquer layer 5 in such a way that the dam 8 laterally surrounds the LED chip or LED chips 2. The dam 8 is preferably formed as a ring-shaped dam (e.g. torus). Preferably, the dam 8 composed of a liquid polymer or resin or a polymer mixture is applied around the LED chips 2 on the metallic layer 4. Alternatively, the dam 8 can also extend at least partly over the preferably printed ceramic lacquer layer 5.

It should be emphasized that "ring" or "ring-shaped", in connection with the present description and the claims, does not constitute any restriction with regard to the contour of the walls of the dam 8; by way of example, the ring need not necessarily have a circular shape, but rather can have e.g. the shape of a square, an oval, an ellipse or a rectangle, etc. The circular shape is preferred owing to the closeness in use to reflectors of round design, since the plurality of LEDs preferably appear as an individual round optical element. A square shape is preferred on account of the simpler arrangement in terms of production engineering.

Preferably, a planar board is used as the carrier 3 without depressions, since the reflective effect of walls of a depression can be achieved by means of the dam walls.

Dispensing techniques for resins and silicones and the like are known as such from the prior art. The cross-sectional shape of the dam 8 can be controlled by the diameter of the dispensing needle used, the flow characteristic of the liquid dam material and the flow (dispensing) rate. In a manner governed by the dispensing technique, e.g. the cross section of the dam toward the apex of the dam 8 can have a tapering shape. As a result, the inner surface of the dam 8 is beveled and advantageously steeper at its upper part, which can be advantageous for reflection purposes.

Besides dispensing, the dam 8 can also be produced by means of so-called overmolding. If it can then no longer be used for protecting the wire bonds, the emitting surface increases slightly. Alternatively, the dam 8 can also be provided as a prefabricated element which is preferably produced from a polymer or resin, ceramic, metal or some other plastic, e.g. as an injection-molded part.

In an optional fifth step of the production process following the fourth step, the space surrounding by the dam 8 is filled with a filling material. In other words, the volume delimited by the inner walls of the inherently stable ring 8 is filled with a liquid filling material. As can be seen in FIG. 1, this central filling 9 is preferably produced such that the top side of the filling 9 terminates flush with the top side of the walls of the dam 8. Particularly preferably, the central filling 9 is provided in such a way that it covers or coats the top side of the LED chip 2 in its entirety. The central filling 9 likewise covers the space between the LED chip 2 and the walls of the dam 8 and touches the lacquer layer 5 and, via clearances 6 in the lacquer, the metallic layer (silver layer or ultrapure aluminum layer or the like) 4 or the adhesive used for applying the LED chips 2. On account of the preferred filling with a liquid polymer or resin, the top side of the central filling 9 is preferably embodied in a flat fashion.

Preferably, liquid uncured polymer or resin (e.g. silicone) is thus filled into a cavity produced by an inherently stable dam 8 composed of uncured polymer/resin. In this case, the materials of the dam 8 and of the central filling 9 are preferably similar or the same, such that these are preferably chemically identical. The chemical identity should be such that the material used for the dam 8 and the central filling 9 can be cured in each case by the use of the same curing mechanism, in order preferably to produce a chemical and/or physical bond between the two materials across the interface thereof.

With regard to optical and mechanical characteristics, the materials of the dam 8 and of the central filling 9 can be different; in this regard, the material of the dam 8, which material is preferably identical to the material of the central filling, can also be equipped with different "additives" than the material of the central filling 9. For colored LED modules (e.g. blue, green, amber and red) it is not necessary to add additional fillers to the polymer or resin for the central filling 9. On the other hand, for white color conversion LED modules, color conversion particles can be added to the filling material of the central filling 9. The type and amount of the color conversion particles depend on the desired color temperature of the LED module 1, which are known as such from the prior art. Preferably, there is an increasing concentration gradient of the color conversion particles from top to bottom, which can be achieved e.g. by sedimentation of the color conversion particles to the bottom of the filling 9.

If the dam 8 and the central filling 9 are produced from a liquid polymer or resin or a polymer mixture, then this is preferably cured after applying and filling, respectively. The step of applying the dam 8 and the step of filling the dam 8 with the filling material thus furthermore preferably comprise curing the dam 8, which is preferably produced from a liquid polymer/polymer mixture, and curing the filling material of the central filling 9, said filling material preferably being produced from a liquid polymer/polymer mixture. The curing of the dam 8 and the curing of the central filling 9 can be carried out after the respective steps for providing the dam 8 and the central filling 9—that is to say independently of one another.

In one particularly preferred embodiment, the liquid polymer (mixtures), i.e. the polymers or resins of the central filling 9 and of the dam 8, can be cured by an individual curing process and thus preferably be chemically bonded to one another at their interface. This production process is based on a comparatively high mechanical stability of the material of the wall of the dam 8 in the uncured "liquid" state. It is again possible, in order to obtain this mechanical stability in a liquid state, to add additional filling materials, such as silicones, for example, to the material of the dam 8. The joint curing of the dam 8 and of the central filling 9 thus has the advantage that a polymerization can take place between the dam material and the matrix material of the central filling 9.

A standardized computer-controlled administering device can be used both for producing the dam 8 and for producing the filling 9.

The invention is not restricted to the exemplary embodiments described above as long as it is encompassed by the subject matter of the following claims.

In this regard, it is conceivable that firstly the LED chips 2 are applied to the carrier 3 and then the carrier 3 (excluding the LED chips 2) is coated with the metallic layer 4 and then the lacquer layer 5 is subsequently applied. All that is crucial is that the combination of lacquer layer 5 and metallic layer 4 forms a doubly reflective effect for the light emitted by the LED chip 2, such that the light from the LED chip 2 passing through the lacquer layer 5 is reflected back on account of the underlying metallic (silver) layer 4 and the efficiency of the module 1 is thus increased.

Moreover, the module 1 can be embodied e.g. generally as an electronic or optoelectronic module and can comprise other electronic or optoelectronic components instead of an LED chip.

By way of example, the module 1 can be embodied as a light-erasable memory device, such as an EEPROM, for example. The invention can likewise be used for light-sensitive sensors, such as, for example, RGB sensors, infrared sensors or CCD sensors. Infrared emitters and light-sensitive light detection devices are likewise areas of application, in particular if the sensor is present as a bare chip using COB or leadframe technology.

The coating can, in conformity with the present invention, also be used in connection with light guides and optical fibers. An optical fiber to which light from the light source 2 is intended to be transferred is preferably arranged at a distance from and in front of the light source 2 and extends e.g. out of the filling material 9 away from the light source 2. Furthermore, the module 1 can be provided with a mechanical fixing for the optical fibers. Such an arrangement provides for improved light transfer from the light source 2 to the optical fiber.

LIST OF REFERENCE SIGNS

1 LED module
2 LED chip
3 Carrier
4 Metallic layer
5 Lacquer layer
50 Edge boundary of the lacquer layer
6 Clearance
7 Gap
8 Dam
9 Central filling
10 Regions not covered by the lacquer layer
11 Bonding pad
12 Bonding wire
13 Base substrate
14 Cutout
15 Reflector
16 Additional substrate 17 Carrier surface below the dam
18 The surface area occupied by the LED chips
31 Printed circuit board
32 String of the LED chips
20 Side wall of the LED chip
21 Top side of the LED chip
80 Space surrounding (outwardly delimited) by the dam
90 Scattering particles

The invention claimed is:

1. An LED module, comprising:
   a carrier having a reflectance, having a metallic layer comprising a silver layer or a layer composed of ultrapure aluminum, applied on the carrier,
   an oxide layer deposited on the metallic layer,
   a lacquer layer is provided above the metallic layer or the oxide layer such that the lacquer layer completely covers the metallic layer,
   an LED chip arranged on the lacquer layer, and
   a dam above the metallic layer or the oxide layer laterally surrounding the LED chip,
   wherein the lacquer layer extends as far as the carrier below the dam and covers a surface of the carrier below the dam such that the lacquer layer is entirely circumferentially within the dam and the lacquer layer is encapsulated by a central filling; and
   wherein the LED module is configured in such a way that at least part of light incident on the module, emitted from the LED chip, is reflected by the metal layer.

2. The LED module as claimed in claim 1, wherein the LED chip is mounted on the lacquer layer.

3. The LED module as claimed in claim 1, wherein the metallic layer consists of a bondable surface region and a non-bondable surface regions protected against alteration by a protective oxide or organic layer.

4. The LED module as claimed in claim 1, wherein the metallic layer is additionally protected against alteration by the oxide layer or an organic layer.

5. The LED module as claimed in claim 1, wherein the LED chip is applied on one of the metallic layer, on the lacquer layer, on the oxide layer, or directly on the carrier.

6. The LED module as claimed in claim 1, wherein the lacquer layer has an average thickness of 5 to 250 µm.

7. The LED module as claim 1, wherein the metallic layer has a thickness of 30 nm to 8000 nm.

8. The LED module as claimed in claim 1, wherein the carrier comprises a printed circuit board.

9. The LED module as claimed in claim 8, wherein the carrier further comprises a base substrate connected to the printed circuit board by an adhesive.

10. The LED module as claimed in claim 9, wherein the base substrate has a thickness of 0.5 to 5 mm.

11. The LED module as claimed in claim 9, wherein the printed circuit board has at least one cutout in a region in which the LED chips are provided.

12. The LED module as claimed in claim 1, wherein LED chips are mounted within the dam connected in series and structured in strings.

13. The LED module as claimed in claim 12, wherein a string preferably contains 5-26 LED chips.

14. The LED module as claimed in claim 12, wherein the LED chips are set up in 1-15 strings on the LED module.

15. The LED module as claimed in claim 1, wherein the LED module is equipped with from 10 to 370 LED chips, spaced uniformly at a distance from one another.

16. The LED module as claimed in claim 1, further comprising a reflector and an additional substrate.

17. A spotlight or a retrofit LED lamp comprising at least one LED module as claimed in claim 1, further comprising one or more of:
   a housing,
   a reflector,
   a driver circuit,
   a sensor system,
   a heat sink, and
   a lamp base.

18. The LED module as claimed in claim 1, further comprising a printed circuit board arranged partially or fully within the dam.

* * * * *